(12) United States Patent
Maurer

(10) Patent No.: US 8,977,664 B2
(45) Date of Patent: Mar. 10, 2015

(54) SYSTEM FOR STORING AND TRANSMITTING COMPRESSED INTEGER DATA

(75) Inventor: Steven Douglas Maurer, Aloha, OR (US)

(73) Assignee: CA, Inc., New York, NY (US)

( * ) Notice: Subject to any disclaimer, the term of this patent is extended or adjusted under 35 U.S.C. 154(b) by 1112 days.

(21) Appl. No.: 12/707,582

(22) Filed: Feb. 17, 2010

(65) Prior Publication Data

US 2011/0202584 A1 Aug. 18, 2011

(51) Int. Cl.
*G06F 7/00* (2006.01)
*H03M 7/40* (2006.01)
*H03M 7/14* (2006.01)

(52) U.S. Cl.
CPC . *H03M 7/40* (2013.01); *H03M 7/14* (2013.01)
USPC ............................................. 708/208; 341/67

(58) Field of Classification Search
CPC .................................. H03M 7/30; H03M 7/40
USPC ........................................... 708/203; 341/67
See application file for complete search history.

(56) References Cited

U.S. PATENT DOCUMENTS 7,924,178 B2 * 4/2011 Sluiter ............................ 341/51
8,321,485 B2 * 11/2012 Yasuda et al. .................. 707/830

FOREIGN PATENT DOCUMENTS

JP 11088189 3/1999

OTHER PUBLICATIONS

Amendment filed Mar. 14, 2012 in European Patent Application No. 11250188.7.
Office Action dated Feb. 21, 2012 in Japanese Application No. 2011-030873.
Elias, Peter, "Universal Codeword Sets and Representations of the Integers", IEEE Transactions on Information Theory, vol. IT-21, No. 2, Mar. 1975.
English Abstract of Publication No. JP11088189 published on Mar. 30, 1999.
Response to Office Action filed May 11, 2012 in Japanese Patent Application No. 2011-030873.
Extended European Search Report dated Jul. 6, 2011 in European Patent Application No. EP11250188.7.
Wikipedia, "Elias delta coding", Dec. 15, 2009.
Communication dated dated Aug. 1, 2011 in European Patent Application No. EP11250188.7.
Communication dated dated Aug. 1, 2012 in European Patent Application No. EP11250188.7.
Response to Official Communication filed Dec. 11, 2012 in European Patent Application No. EP11250188.7.
Summons to attend oral proceedings dated Aug. 27, 2013 in European Patent Application No. EP11250188.7.

* cited by examiner

*Primary Examiner* — Chuong D Ngo

(74) *Attorney, Agent, or Firm* — Vierra Magen Marcus LLP

(57) ABSTRACT

A method is disclosed for encoding and decoding integer values ranging over a known gamut of values used by a data system. By noting that a data system may store and/or transmit integer values over a predefined gamut having a minimum and a maximum limit, integer values at or near the maximum may be compressed to a greater degree than in conventional systems without any loss of data resolution.

9 Claims, 8 Drawing Sheets

Fig. 1
(Prior Art)
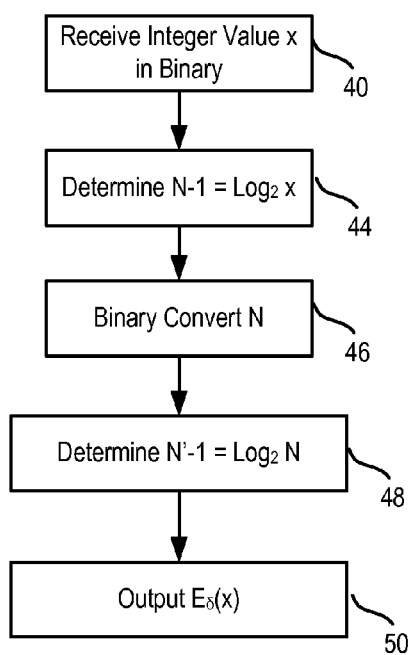
Fig. 3
(Prior Art)
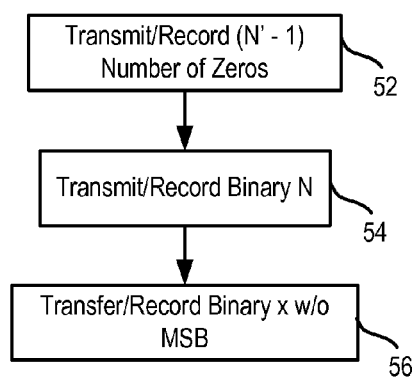
Fig. 2
(Prior Art)
| Integer x | | $E_\delta(x)$ |
|---|---|---|
| 0 | → | 10 |
| 1 | → | 11 |
| 2 | → | 0100 |
| 3 | → | 0101 |
| 4 | → | 01100 |
| 5 | → | 01101 |
| 6 | → | 01110 |
| 7 | → | 01111 |
| 8 | → | 00100000 |
| 9 | → | 00100001 |
| 10 | → | 00100010 |
| 11 | → | 00100011 |
| 12 | → | 00100100 |
| 13 | → | 00100101 |
| 14 | → | 00100110 |
| 15 | → | 00100111 |
| 16 | → | 001010000 |
| ... | | ... |
| 32 | → | 0011000000 |
| ... | | ... |
| 64 | → | 00111000000 |
| ... | | ... |
| 128 | → | 00010000000000 |

| Integer | $E_\delta(x)$ | $M(x)$ |
|---|---|---|
| 0: | 10 | 10 |
| 1: | 11 | 11 |
| 2: | 0100 | 0100 |
| 3: | 0101 | 0101 |
| 4: | 01100 | 01100 |
| 5: | 01101 | 01101 |
| 6: | 01110 | 01110 |
| 7: | 01111 | 01111 |
| 8: | 00100000 | 00000 |
| 9: | 00100001 | 00001 |
| 10: | 00100010 | 00010 |
| 11: | 00100011 | 00011 |
| 12: | 00100100 | 00100 |
| 13: | 00100101 | 00101 |
| 14: | 00100110 | 00110 |
| 15: | 00100111 | 00111 |

| Integer | $E_\delta(x)$ | $M_\delta(x)$ |
|---------|---------------|---------------|
| 128 | 00010000000000 | 0000000000 |
| 129 | 00010000000001 | 0000000001 |
| ... | ... | ... |
| 254 | 00010001111110 | 0001111110 |
| 255 | 00010001111111 | 0001111111 |

SYSTEM FOR STORING AND TRANSMITTING COMPRESSED INTEGER DATA

BACKGROUND

1. Field

The present system is related to the compression of integer data.

2. Description of the Related Art

As the Internet's popularity grows, more businesses are establishing a presence on the Internet. These businesses typically set up web sites that run one or more web applications. One disadvantage of doing business on the Internet is that if the web site goes down, becomes unresponsive or otherwise is not properly serving customers, the business is losing potential sales and/or customers. Similar issues exist with Intranets and Extranets. Thus, service oriented architecture (SOA) application management solutions have been developed which proactively detect and diagnose performance problems for web applications and web sites to ensure that they run properly. One such application management system is Introscope® by CA, Inc., Wily Technology Division, South San Francisco, Calif.

Applications such as Introscope® acquire and store a tremendous amount of data for their operation, and rely on data compression techniques to minimize storage space and transmission bandwidth. In general, data compression schemes involve an encoding engine which encodes data prior to storage or transmission, and a decoding engine which is capable of performing the reverse operation to decode the data upon receipt or retrieval from storage. One type of compression technique is a lossy data compression, where high compression rates are achieved, but at the sacrifice of some resolution of the original encoded data upon decoding. Lossy data compression techniques are often used to transmit multi-media data requiring high bandwidth transfer rates and where loss of some fidelity in the data will not be perceptible in the decoded media.

Other situations require lossless data compression where the decoded data is a full reconstruction of the encoded data. One well known technique for lossless compression of positive integers is called the Elias Delta coding algorithm, developed by M.I.T. professor Peter Elias in the 1970's. The conventional Elias Delta scheme for coding a natural number $x \in \mathcal{N} = \{1, 2, 3, \ldots\}$ will now be explained with reference to the prior art flowchart of FIG. 1 and a specific arbitrary example showing the Elias Delta coding of the integer value x=13. In step 40 the integer data value is received in binary format:

$$13_{base\ 10} = 1101_{base\ 2}$$

In step 44, the number of digits, N, in the binary value of step 42 is determined.

$$1101\ has\ N=4\ digits$$

N may be determined mathematically by noting N−1 is the highest whole number power of 2 contained in the original integer value x. Stated another way, N−1=the largest integer contained in $\mathrm{Log}_2$ x. This is commonly written N−1=$\mathrm{Log}_2$ x, and is referred to with this notation herein.

$$N-1 = \mathrm{Log}_2 13 \rightarrow N-1=3;\ N=4.$$

Another way of describing N is that N is the number of digits in the binary representation of x, and N−1 is the number of digits in the binary representation of x with the most significant bit (MSB) removed.

In step 46, N is converted to a binary number:

$$4_{base\ 10} = 100_{base\ 2}$$

And in step 48, the number of digits, N', in the binary conversion of N is determined.

$$100\ has\ N'=3\ digits;\ N'-1=2.$$

Again, N' may be determined mathematically by noting N'−1 is the highest whole number power of 2 contained in N.

$$N'-1 = \mathrm{Log}_2 4 \rightarrow N'-1=2,\ N'=3.$$

The Elias Delta code $E_\delta(x)$ for the original integer x is then obtained from three sub parts:
$E_\delta(x)_1$=N'−1 number of zeros (step 48);
$E_\delta(x)_2$=binary representation of N (step 42); and
$E_\delta(x)_3$=The remaining N−1 digits of the binary representation of x (i.e., the binary representation of x with the MSB removed).

Thus, $E_\delta(13)$=

$$E_\delta(13)_1 = 00$$

$$E_\delta(13)_2 = 100$$

$$E_\delta(13)_3 = \cancel{1}\ 101 = 101$$

$$E_\delta(13) = 00100101.$$

The prior art in FIG. 2 shows the Elias Delta code values for the integers 0 through 16 as well as larger numbers 32, 64 and 128.

Once the Elias Delta code value for an integer is obtained, it may be output in step 50. The output may be from a processor to a persistent storage media, or the output may be from the processor to a communications interface for transmission to another computing device. The Elias Delta code value for an integer may be stored on a persistent storage media or transmitted via a network connection as a single value. Alternatively, as shown in prior art FIG. 3, it may be transmitted in its sub-components $E_\delta(x)1$, $E_\delta(x)2$ and $E_\delta(x)3$. Namely, $E_\delta(x)1$ may be transmitted or stored in a FIFO data structure in a step 52. $E_\delta(x)2$ may be transmitted or stored in a FIFO data structure in a step 54. And $E_\delta(x)3$ may be transmitted or stored in a FIFO data structure in a step 56. The sub-components are transferred and stored in the above order so that when they are received or retrieved from the FIFO data structure, the subcomponents needed to decode other subcomponents of the Elias Delta code are examined in the proper order. In order to reconstruct the original integer value from the Elias Delta code value, the reverse operations may be performed on the Elias Delta code values.

One problem with the Elias Delta coding scheme is that it must work for any input integer value and it must therefore reserve code space for any value. As can be seen for example in FIG. 2, for large input values such as x=64, the $E_\delta(64)$ takes up more storage space and/or transmission bandwidth than the native binary value itself ($E_\delta(64)$=00111000000 as compared to 1000000 for the binary value). However, in many real world applications, the input integer value is bounded. For example, a register may have a given size, e.g., 4 bits. As another example, many classes of data have a size set by industry standard, e.g., transmission of color values in multimedia stream range between 0 and 255 and they are contained within 8 bits. Elias Delta coding does not take advantage of this knowledge that data systems are often bounded so that input values range over a gamut having a known minimum and a known maximum.

SUMMARY OF THE INVENTION

The present invention, roughly described, pertains to a system where integer values to be transmitted and/or stored may be compressed with a higher compression ratio as compared to traditional compression techniques such as Elias Delta coding. In particular, by noting that a data system may store and/or transmit integer values over a predefined gamut having not only a minimum but a maximum limit, integer values at or near the maximum may be compressed to a greater degree than in conventional systems without any loss of data resolution. The present technology has parallels to Elias Delta coding. However, where it is determined that the number of digits in the binary integer to be stored or transmitted is equal to a predefined maximum number of digits for a given data system, the storage and/or transmission of the binary representation of $\log_{(2)}$ of the integer value may be left out of the storage or transmission, thereby resulting in a greater compression ratio as compared to conventional Elias Delta coding.

The compression scheme of the present technology may have broad application in a wide variety of data systems. However, in one application, the present technology is used to compress data associated with application management systems which proactively detect and diagnose performance problems for web applications and web sites to ensure that they run properly.

The present technology can be accomplished using hardware, software, or a combination of both hardware and software. The software used for the present invention is stored on one or more processor readable storage media including hard disk drives, CD-ROMs, DVDs, optical disks, floppy disks, tape drives, RAM, ROM or other suitable storage devices. In alternative embodiments, some or all of the software can be replaced by dedicated hardware including custom integrated circuits, gate arrays, FPGAs, PLDs, and special purpose computers. In one embodiment, software implementing the present invention is used to program one or more processors. The processors can be in communication with one or more storage devices, peripherals and/or communication interfaces.

BRIEF DESCRIPTION OF THE DRAWINGS

FIG. 1 is a prior art flowchart showing a method of encoding integer values according to the Elias Delta coding scheme.

FIG. 2 is a prior art table showing Elias Delta code values for various integers.

FIG. 3 is a prior art flowchart showing the steps for transmitting or recording sub-components of an Elias Delta code value.

DETAILED DESCRIPTION

The present technology will now be described with respect to FIGS. 4-11, which in general relate to a system for compressing integer data ranging within a known gamut of possible integers. As embodiments of the present technology may be particularly effective at compressing high order integer values near the upper limit of a predefined gamut, embodiments of the present technology may be referred to herein as a "high order compression scheme." One particular system in which the high order compression scheme may be used is described hereinafter with reference to an SOA application for detecting and diagnosing performance problems for web applications and web sites to ensure that they run properly. One such application management system is Introscope® by CA, Inc., Wily Technology Division, South San Francisco, Calif. Such a system is described below with reference to the block diagram of FIG. 10. However, it is understood that the high order compression scheme as described herein may be used in any of a wide variety of software applications where integer values ranging within a predefined gamut are transmitted and/or stored.

Figure 4:
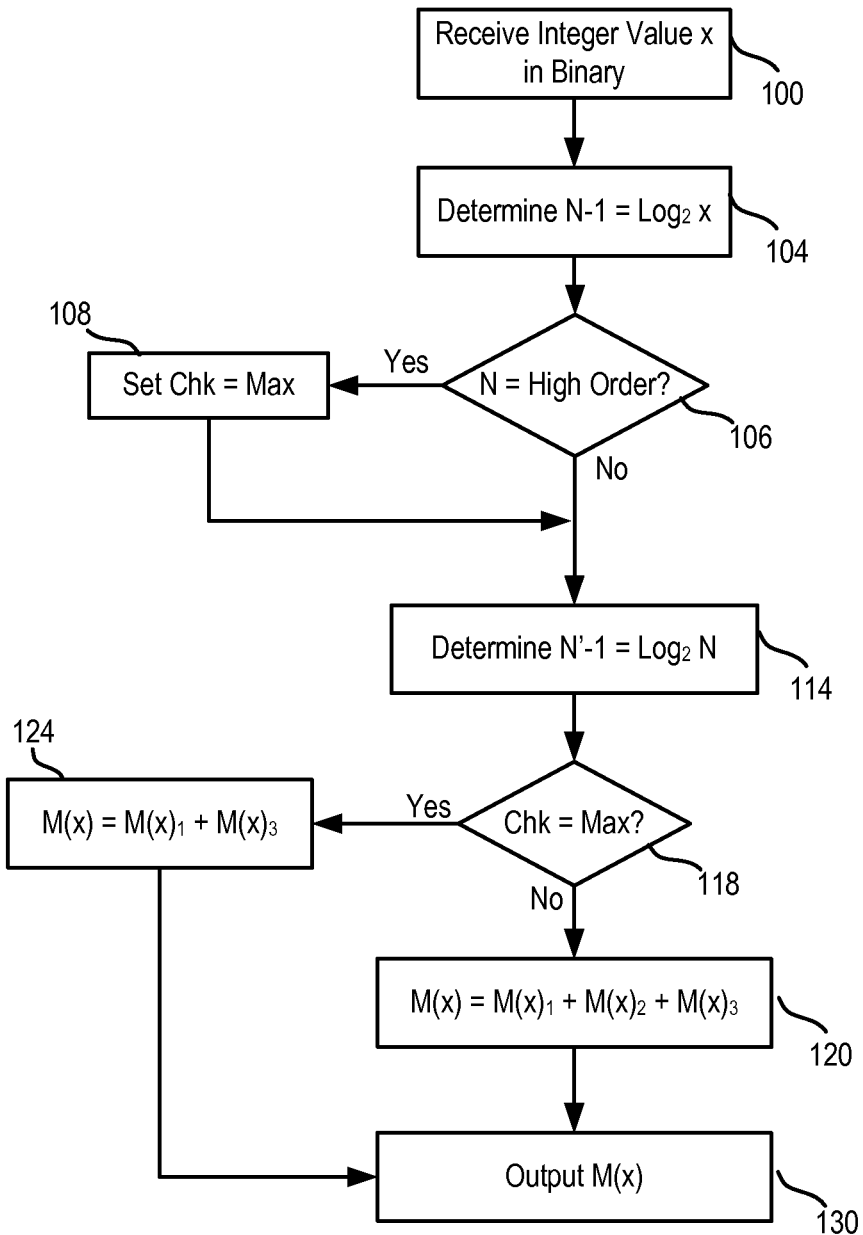
FIG. 4 is a flowchart for encoding integers according to a high value compression scheme according to the present system.

Referring now to FIG. 4, there is shown a flowchart for encoding integer values according to an embodiment of the high order compression scheme of the present technology. The scheme may be used to compress integer values in any data system where the possible gamut of stored/transmitted integer values are bounded by a minimum (i.e., zero) and some maximum value. This range may typically have a minimum integer value of zero, but the minimum need not be zero in further embodiments.

With regard to the maximum integer value, many data systems and software applications work with a range of data values that are naturally limited by a system constraint. For example, a data system may use a register, address bus or data bus able to work with numbers of a set, predetermined size, such as for example 4 bits, so as to receive 16 possible integer values, e.g., between 0 and 15. As a further example, many application programs transmit and store data having a size and format that is set by industry standard. As one of many examples, data describing the color of a pixel in a bit mapped image or video frame buffer is often transmitted and stored as one of 256 values in an 8 bit format. Other telecommunications, audio and video data are stored in standard 8 bit, 16 bit, etc. data lengths.

Embodiments of the high order compression scheme assume that transmitted and stored integer values range over a gamut having a known maximum. The knowledge of the maximum is used by an encoding engine and a decoding engine implementing the high order compression scheme as explained below to improve the compression ratio of the compressed data. In embodiments, the present system operates with a maximum number of integer values equal to $2^i$, where i is a power of two (i=2, 4, 8, 16, 32, 64 ... ). However, alternative embodiments of the present system may operate to compress and decode data having other integer value ranges in further embodiments.

An embodiment of the present system will now be described with reference to the flowchart of FIG. 4 for use in a data system for storing or transmitting up to 16 different integer values transmitted/stored in 4 bits. Thus, the maximum number of bits for the binary representation of any integer value over the gamut will be 4 bits. As indicated above, the present technology may be used in data systems working with a larger or smaller maximum number of binary digits in further embodiments. As used herein, the term "high order integer values" refer to the integer values whose binary representation have the same number of digits as the maximum allowed for a given data system. For example, the high order compression scheme may be used in a system working with 16 integer values taking up a maximum of 4 bits. In such a system, the integer values 8 ($1000_{base2}$) through 15 ($1111_{base2}$) would be referred to as high order integer values. The same integer values would not be considered high order integer values in a system working, for example, with 256 integer values in 8 bits.

Figure 10:
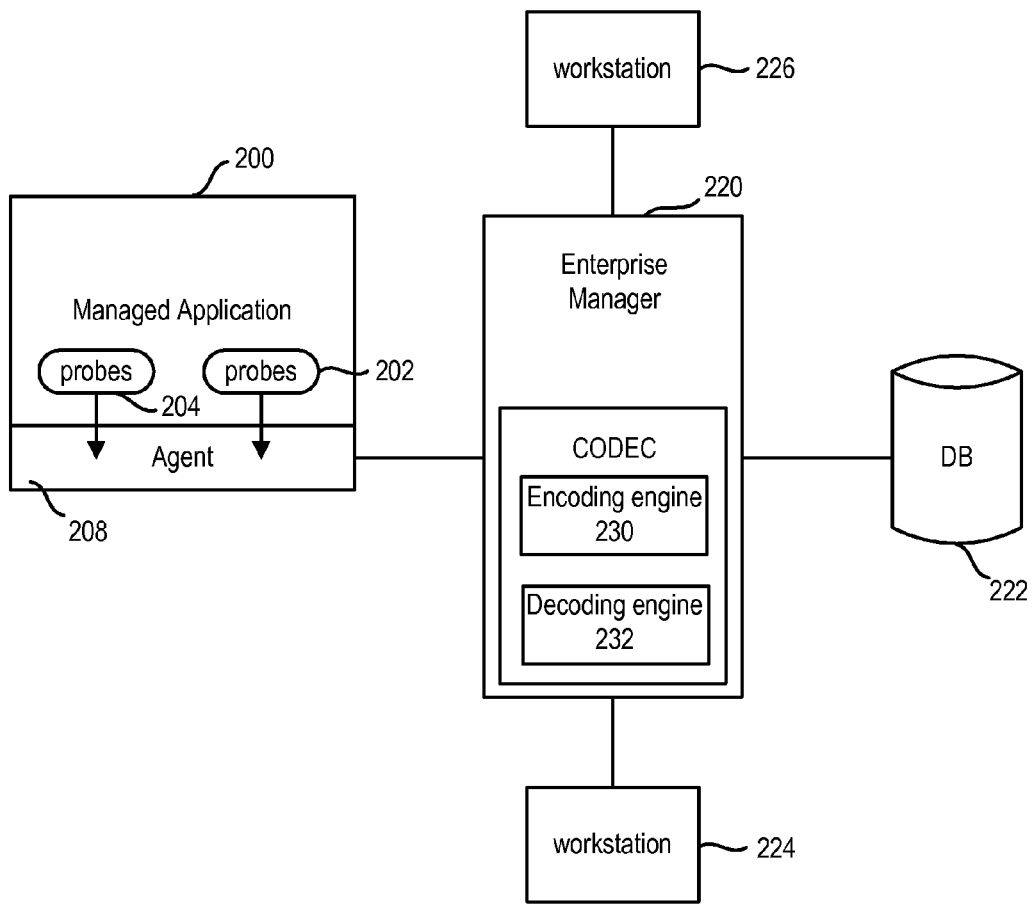
FIG. 10 is a block diagram of an embodiment in which integer values encoded using the high order compression scheme may be stored and/or transmitted.

The high order compression scheme described below may be performed by an encoding engine 230 (FIG. 10). For the purposes of explanation, the flowchart of FIG. 4 will be explained with reference to the encoding of an arbitrarily selected integer value of x=14 in a data system accepting a maximum of 16 integer values. However, it is understood that, in such a data system, the present technology may receive and encode any of 16 possible integer values. In step 100, the encoding engine receives the integer value x in binary. In the current example:

$x=14_{base(10)}=1110_{base(2)}$.

In step 104, the encoding engine 230 determines the number of bits, N, in the binary value of the integer. As described in the Background section, this may be determined by $N-1=\log_2 x$:

$N-1=\log_2 14 \rightarrow N-1=3, N=4$.

Those of skill in the art may understand alternative or additional methods of determining the number of digits in the binary representation of the integer value.

In step 106, the encoding engine 230 determines whether N is equal to the maximum $\log_2$ of the known gamut. In this example, the maximum value of N is 4. As N equals 4 for the integer x=14, the encoding engine would set a flag in step 108 indicating that N for the received integer value is at the predetermined maximum value. This is shown in FIG. 4 as setting a flag, "CHK=max". If the value of N in step 106 was less than the maximum value, step 108 would be skipped. In step 114, using the binary form of N ($4_{base10}=100_{base2}$), the number of digits, N', in the binary form of N is determined:

$N'-1=\log_2 N$ $N'-1=\log_2 4 \rightarrow N'-1=2, N'=3$.

Again, those of skill in the art may understand alternative or additional methods of determining the number of digits in the binary representation of N.

After step 114, the encoding engine may determine the high order compression value, denoted herein as M(x). If the integer value x has a number of bits, N, less than the predetermined maximum value (i.e., CHK not equal to max in step 118), then the high order compression value M(x) is determined in step 120 in the same way as the Elias Delta value. That is, the high order compression value $M(x)=M(x)_1$ appended to $M(x)_2$ appended to $M(x)_3$, where:

$M(x)_1$=N'-1 number of zeros (step 114);
$M(x)_2$=the number of bits, N, in the binary representation of x (step 104); and
$M(x)_3$=the remaining N-1 digits of the binary representation of x (i.e., the binary representation of x with the MSB removed).

However, where the integer value x takes up the maximum number of bits over the range of predetermined integer values in step 118, the present system allows a reduction in the size of the encoded value over conventional compression schemes such as the Elias Delta coding scheme. In step 124, if the flag is equal to the maximum value, then the high order compression value $M(x)=M(x)_1$ appended to $M(x)_3$, where $M(x)_1$ and $M(x)_3$ are as described above:

$M(x)_1$=N'-1 number of zeros (step 114); and
$M(x)_3$=The remaining N-1 digits of the binary representation of x (i.e., the binary representation of x with the MSB removed).

As it is known that the received integer value is at the maximum number of digits in its binary representation for the predetermined range, there is no need to reserve space in the encoded value representing the most significant bit (i.e., $M(x)_2$).

In the current example where x=14, the number of bits in the binary representation (i.e., 4) is equal to the predetermined maximum. Thus:

$M(14)=M(14)_1$ appended to $M(14)_3$;
$M(14)_1$=N'-1 number of zeros, or two zeros→$M(14)_1$=00;
$M(14)_3$=The remaining N-1 digits of the binary representation of x with the MSB removed. The binary representation of x=14 is 1110→$M(14)_3$=110.
$M(14)=M(14)_1$ appended to $M(14)_3$;
$M(14)$=00110.

Figures 5, 6:
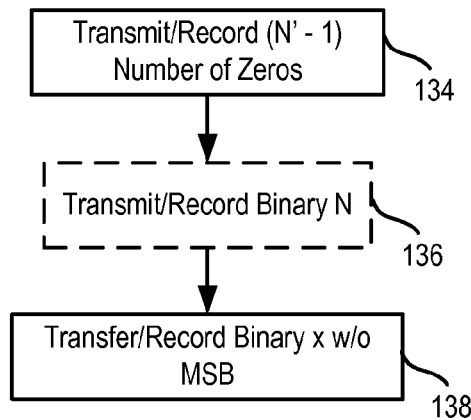
FIG. 5 is a flowchart showing an embodiment of the step of outputting sub-components of the encoded value obtained by the high order compression scheme of the present system.
FIG. 6 is a table showing a comparison of different integer values ranging between 0 and 15 encoded by the Elias Delta scheme and by the high order compression scheme of the present system.

In step 130, the high order compression value M(x) is output. The output may be from a processor to a persistent storage media, or the output may be from the processor to a communications interface for transmission to another computing device. The high order compression value for an integer may be stored on a persistent storage media, or transmitted via a network connection, as a single value. Alternatively, as shown in FIG. 5, it may be transmitted/stored in its sub-components $M(x)_1$, $M(x)_2$ (possibly), and $M(x)_3$. That is, $M(x)_1$ may be transmitted or stored in a FIFO data structure in a step 134. $M(x)_2$ may be transmitted or stored in a FIFO data structure in a step 136 if the binary representation of the integer value is not at the predetermined maximum number of digits. Otherwise, step 136 is skipped. And $M(x)_3$ may be transmitted or stored in a FIFO in data structure in a step 138. The subcomponents are transferred and stored in the above order so that when they are received or retrieved from the FIFO data structure, the subcomponents needed to decode other subcomponents of the high order compression value are examined in the proper order.

It is understood that the sub-components may alternatively be transmitted or stored in a LIFO data structure. In this case, the sub-components would be transmitted or stored in the reverse order from that described above.

Figure 4A:
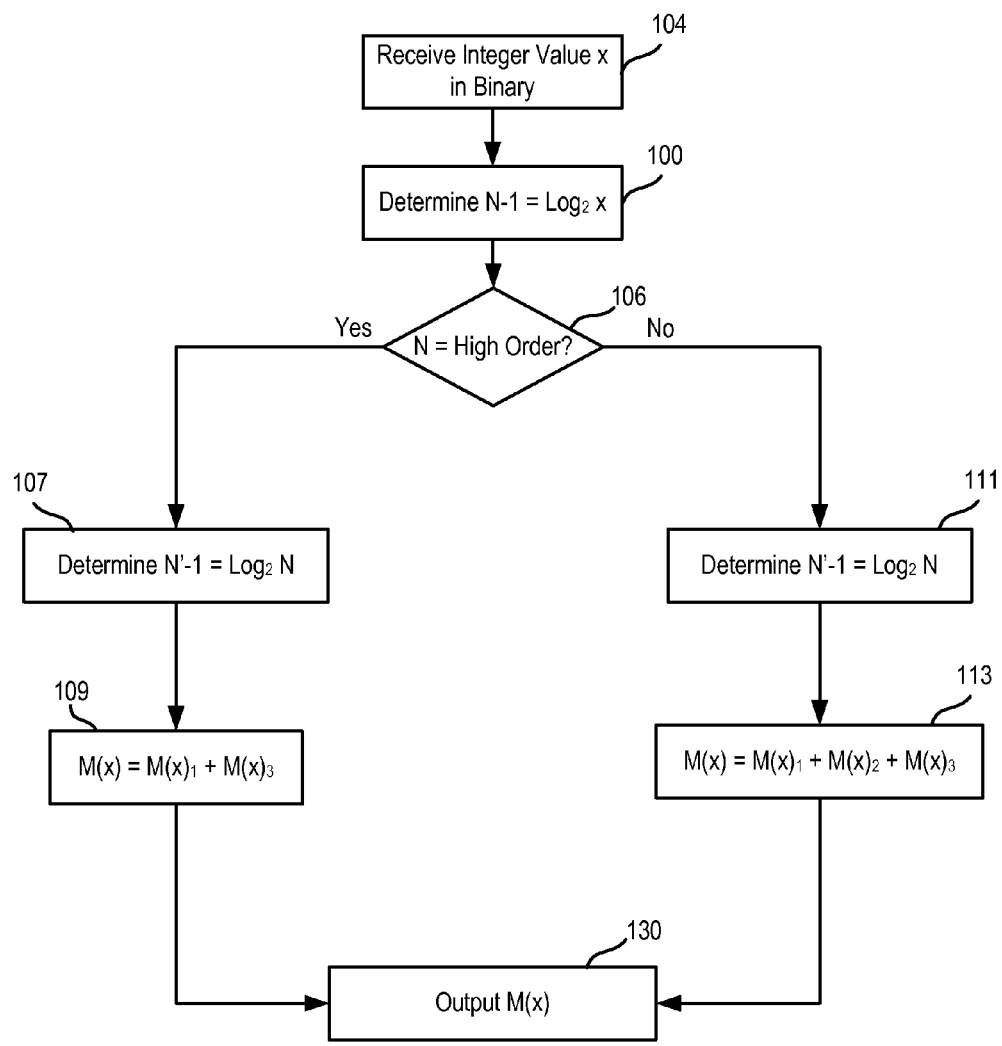
FIG. 4A is a flowchart for encoding integers for to a high value compression scheme according to an alternative embodiment of the present system.

Moreover, it is understood that the steps discussed above in FIG. 4 may be performed by alternative conceptual methods to arrive at the same result as the shown steps. On such alternative is shown in FIG. 4A. FIG. 4A is similar to FIG. 4, but the check to see whether the N is at some predefined maximum is omitted. Instead, the system checks whether N is at the high order in step 106 as described above. If so, the system determines the number of digits, N', in the binary form of N in step 107 as above: N'−1=$\log_2$ N, and M(x) is set to M(x)$_1$ appended to M(x)$_3$ in step 109, where M(x)$_1$ and M(x)$_3$ are as described above. If it is determined in step 106 that N is not at the high order, then the system determines the number of digits, N', in the binary form of N in step 111 as above: N'−1=$\log_2$ N, and M(x) is set to M(x)$_1$ appended to M(x)$_2$ appended to M(x)$_3$ in step 113, where M(x)$_1$, M(x)$_2$ and M(x)$_3$ are as described above. M(x) is then output in step 130 as described above. Again, those of skill in the art will see further alternatives given the above disclosure.

FIG. 6 shows a table for a system where integer values may range between 0 and 15. As seen, for low end integer values (i.e., x≤7 and N<max value of 4) the high order compression value M(x) is the same as the Elias Delta value $E_\delta(x)$. However, for integer values whose binary representation is the maximum number of bits (8≤x≤15 and N=max value of 4), the present compression scheme M(x) offers a reduction in space over the Elias Delta code for storing and/or transmitting the integer values.

Figures 7, 8:
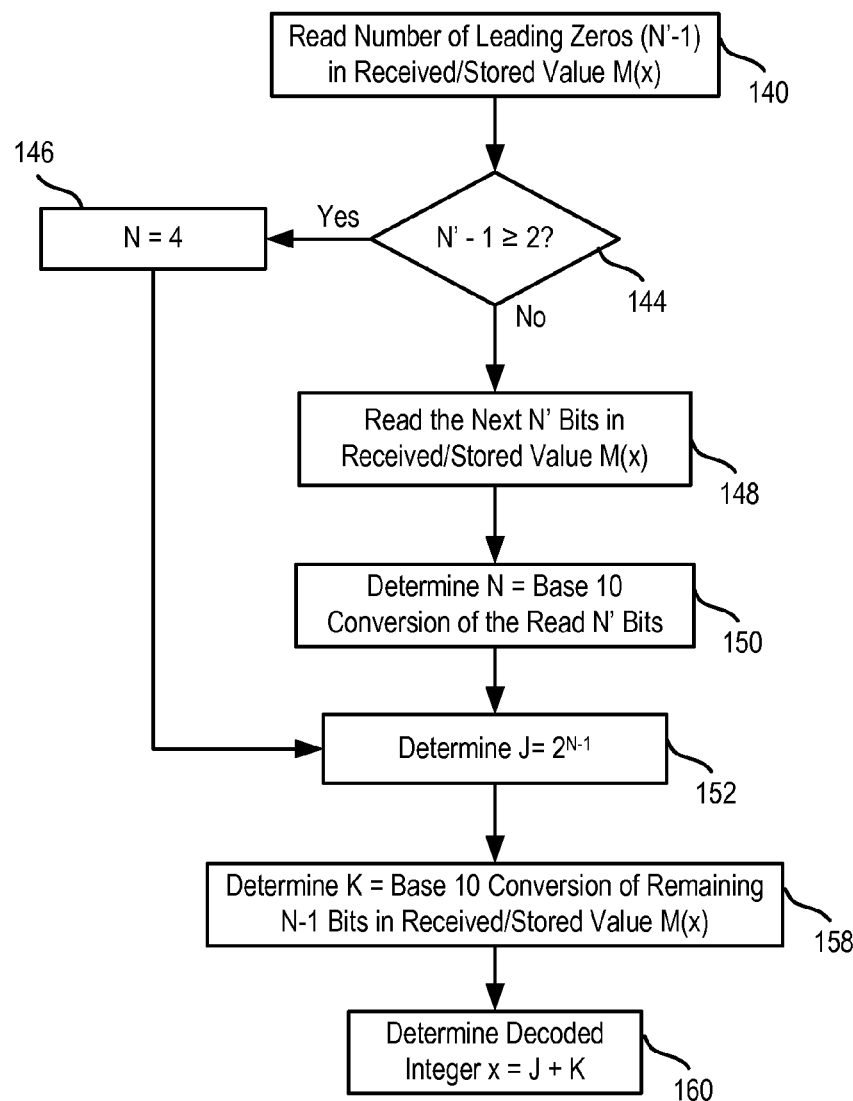
FIG. 7 is a table showing a comparison of certain integer values ranging between 0 and 255 encoded by the Elias Delta coding scheme and the high order compression scheme according to the present technology.
FIG. 8 is a flowchart for decoding values encoded by the high order compression scheme according to the present technology.

FIG. 7 is an example of the high order compression scheme where integer values may range between 0 and 255 (the maximum number of digits in the binary representation equals 8). In such an example, integer values ranging between 0 and 127 will have their high order compression values calculated in the same way as the Elias Delta values. However, for integer values between 128 and 255 (some shown in FIG. 7), these values take up the maximum number of bits, and their high order compression values offer a reduction in the number of digits as compared to Elias Delta coding. As shown, the Elias Delta code for integers ranging between 128 to 255 will have 14 digits, where the high order compression value for integers between 128 and 255 will have only 9 digits. This offers a significant savings in storage space and transmission bandwidth.

When an encoded value is either received upon transmission or retrieved from persistent storage, the encoded value must be decoded. The present system further includes a decoding engine 232 (FIG. 10) capable of reversing the high order compression scheme described above to convert encoded values back into their original integer values. The process of the decoding engine 232 will now be described with reference to the flowchart of FIG. 8. The decoding engine 232 operates using the same predefined minimum and maximum values as the encoding engine 230. Thus, in the example of FIG. 8, the decoding engine 232 is configured to operate over the same gamut of values as the encoding engine 230. In the above example, the values have a range between 0 and 15, and have a maximum number of digits, N, in the binary representation of 4. In FIG. 4 it was determined that M(14)=00110. FIG. 8 will be described with respect to decoding a stored/received value of 00110. However, as above, it is understood that the decoding engine may decode any values across the predefined range of integer values.

The decoding engine 232 may receive the entire high order compression value M(x) to work with, or the decoding engine may receive the first sub-component M(x)$_1$ from a FIFO or LIFO data retrieval structure. In either case, in step 140, the decoding engine receives the first sub-component M(x)$_1$, which is the number of leading zeros in the received or stored value M(x). As above, the number of leading zeros may be referred to here as N'−1.

For M(x)=00110, there are two leading zeros→N'−1=2, and N'=3.

In the high order compression values, the number of leading zeros, N'−1, will indicate the most significant bit, N, of the decoded binary value by the relationship:

$$N'-1 = \text{Log}_2 N$$

In a system where the integer values are constrained between 0 and 15, no leading zeros will indicate an integer value between 0 and 1, one leading zero will indicate an integer value between 2 and 7, and two (or more) leading zeros will indicate an integer value between 8 and 15.

In the above example, the integer values are constrained between 0 and 15 (N=a maximum of 4). However, as indicated above, the present invention may operate with any known gamut. In embodiments, the maximum number of integer values in a known gamut will be equal to $2^i$, where i is a power of two (i=2, 4, 8, 16, 32, 64 . . . ). Thus, in embodiments, the high order compression scheme may work with integer gamuts of 2 values, 4 values, 16 values (as in the above example), 256 values, 65,536 values, etc.

It can be seen that whenever the number of leading zeros in the high order compression value is equal to or greater than the $\log_2$ of the number of binary digits in the maximum integer value for the data system, the high order compression value represents an integer having the maximum number of binary digits for the data system. Thus:

for a gamut between 0 and 3, one leading zero in a given high order compression value indicates that the given high order compression value represents an integer having the maximum number of N=2 bits in the binary representation;

for a gamut between 0 and 15 (as above), two leading zeros in a given high order compression value indicates that the given high order compression value represents an integer having the maximum number of N=4 bits in the binary representation;

for a gamut between 0 and 255, three leading zeros in a given high order compression value indicates that the given high order compression value represents an integer having the maximum number of N=8 bits in the binary representation;

for a gamut between 0 and 65,535, four leading zeros in a given high order compression value indicates that the given high order compression value represents an integer having the maximum number of N=16 bits in the binary representation; etc.

Using this scheme and the known gamut, the decoding engine 232 is able to determine when a high order compression value represents a number at the maximum number of binary digits solely from the number of leading zeros in the high order compression value.

Continuing again with the example of FIG. 8 where the integers range between 0 and 15, in step 140, the decoding engine reads the number of leading zeros. In step 144, if it is determined that there are two or more leading zeros (N'−1 is greater than or equal to 2), the decoding engine can automatically determine that the integer value is between 8 and 15 and has a number of bits, N, equal to 4 in the binary representation of the integer value. Thus, if it is determined in step 144 that N'−1 is greater than or equal to 2, N is set to 4 in step 146 and processing steps 148-150 (described below) may be skipped.

In step 152, a first intermediate decimal value J is defined as being equal to $2^{N-1}$. J represents the decimal representation of the most significant bit. In the example where M(x)=00110, N=4. Thus:

$$J = 2^{N-1} = 2^3 = 8.$$

In step 158, a second intermediate decimal value K is defined as being equal to the base 10 conversion of the received/stored value M(x) with the most significant bit removed. This will be the last N−1 digits of M(x). In the above example where M(x)=00110, it was determined that N=4. Thus, N−1=3 and the last 3 digits of M(x) are 110. Thus, the base 10 conversion, K, of the N−1 digits of M(x) in this example is given by:

$$110_{base\ 2} = K_{base\ 10} \rightarrow K=6.$$

Finally, in step 160, the original integer value, x, is determined by adding the intermediate values J and K together:

$$x = J+K$$

$$x = 8+6 = 14.$$

As seen with respect to FIG. 4, the integer value 14 is encoded by the high order compression scheme into M(14)=00110. As seen with respect to FIG. 8, the high order compression value 00110 may be decoded into the original integer value 14.

In the above description, it was noted that where the leading zeros indicated a decoded binary value having the maximum number of bits, steps 148 and 150 may be skipped, thus resulting in a reduction of processing time. However, where it is determined that the number of digits in the binary representation is less than the maximum, steps 148 and 150 are performed. For example, assume the decoding engine 232 receives a high order compression value M(x)=01101 in a system where the maximum number of bits is still 4 (16 possible integer values in the gamut). In this example, there is one leading zero read in step 140 and N'−1 is not greater than or equal to 2. Accordingly, the decoding engine will perform step 148 and read the N' number of bits in M(x) following the leading zeros. In the example of decoding 01101, there is one leading zero, so N'−1=1, and N'=2. Thus, the 2 bits following the leading zero in M(x) are read. In the example of decoding M(x)=01101, these digits are "11." In step 150, N equals a base ten conversion of the read N' number of bits. In the current example:

$$11_{base\ 2} = 3_{base\ 10} \rightarrow N=3.$$

Step 152 is then performed as described above. The first intermediate value J is determined where N=3

$$J = 2^{N-1} = 2^2 = 4.$$

In step 158, the second intermediate value K is determined. As indicated above, K is the base 10 conversion of the remaining portion of the received/stored value M(x) with the most significant bit removed, i.e., the last N−1 digits of M(x). In the above example where M(x)=01101, it was determined that N=3. Thus, N−1=2 and the last 2 digits of M(x) are "01". Thus, the base 10 conversion, K, of the N−1 digits of M(x) in this example is given by:

$$01_{base\ 2} = K_{base\ 10} \rightarrow K=1.$$

Finally, in step 160, the original integer value, x, is determined by adding the intermediate values J and K together:

$$x = J+K$$

$$x = 4+1 = 5.$$

It is understood that the steps discussed above in FIG. 8 may be performed by alternative conceptual methods to arrive at the same result as the shown steps.

As described above, in embodiments, any predefined gamut of integer values will have a maximum number of binary digits N that satisfy $N=2^i$, where i is a power of 2. This constraint allows the decoder to automatically determine when an encoded high order compression value represents a high order integer value in the predefined gamut. Were it not a constraint on the system that i is a power of 2, the decoding of the high order compression values would be more compli-cated in that assumptions regarding N could not be made based on the leading number of zeros. For example, in a system having 16 possible integers where N is constrained to be $2^i$, it is known that, where there are 2 leading zeros in M(x), N'−1=2 and N' is a 3 bit binary number equal to $100_{base\ 2}$, or $N = 4_{base\ 10}$.

However, in a system having 16 possible integers where N is not constrained to be $2^i$, it cannot be assumed that N=4 when there are 2 leading zeros. For example, where there are 2 leading zeros in M(x), N'−1=2 and thus N' is a 3 bit binary number which could be 100 (N=4), 101 (N=5), 110 (N=6) or 111 (N=7).

However, although more complicated, embodiments of the high order compression scheme may work with values of N that are not constrained to be $2^i$, where i is a power of 2. This is so because the M(x) encoding of such values will still be unique for each possible value of N. In such embodiments, the leading zeros alone in the encoded value M(x) would not dictate the value of N, but additional steps may be performed in examining further digits of M(x) to allow M(x) to be decoded into its original integer value.

In embodiments, the high order compression scheme may result in efficiencies in coding the high order integer values, but not for integers below the high order integer values. In further embodiments, this issue may be addressed by employing a known regularization scheme to add and/or subtract some constant to integer values in a gamut prior to encoding by the high order compression scheme. The constant will depend on the size of the gamut. It is noted that in the example in FIG. 6 above with a 16 value gamut, this regularization step yields no benefit as the number of bits to encode the values at the top of the range are not less than the bits needed to code lower values. This situation is not the case for larger gamuts.

Figure 9:
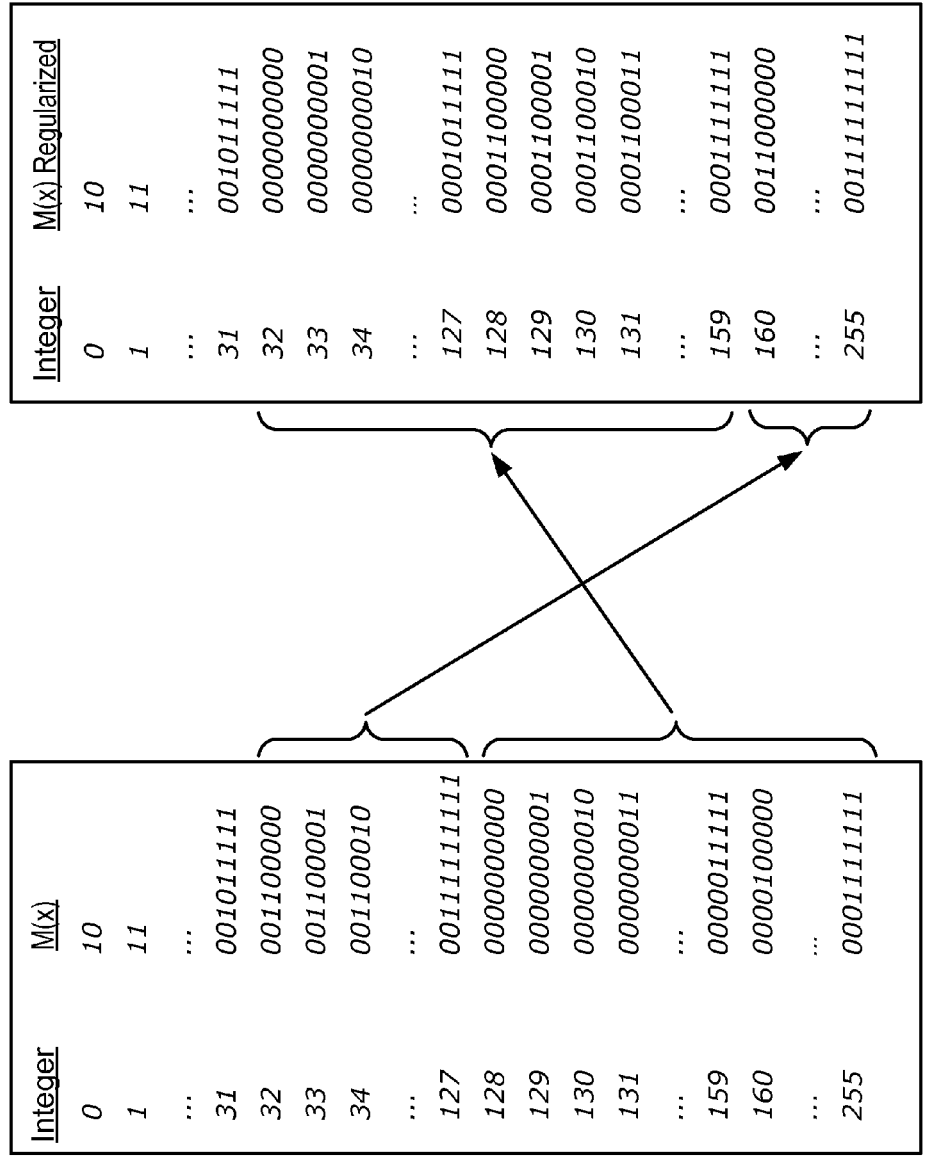
FIG. 9 shows a first table including integer values and the corresponding high order compression values, and a second table including integer values and the corresponding regularized high order compression values.

For example, the advantage of a regularized high order compression scheme is evident in FIG. 9. FIG. 9 shows portions of an integer coding across an 8 bit gamut (256 integer values). In its unregularized version, the high order compression scheme uses more bits to code a value in the range 64 through 127, than it does to code a 128. For certain value distributions, this may be suboptimal. A process of regularization may address this for example by using the bit codes that represent 128-255 to instead represent the values 32-159, and the bit codes that represent 32-127 to instead represent 160-255. This may be achieved by adding and/or subtracting a constant (the value of which depends on the specific gamut range) during the encode/decode process. In the example of FIG. 9, any value between 32-159 has 96 added to it prior to unregularized high order compression encoding, and any value in the range 160-255 has 128 subtracted from it prior to unregularized high order compression encoding. After this shift, the high order compression scheme is performed as described above. The reverse is performed on decode.

As indicated above, embodiments of the high order compression scheme may be used in a wide variety of situations where integer data is stored and/or transmitted. One embodiment where the high order compression scheme may be used is explained below with reference to the block diagram of FIG. 10. This system is described in greater detail in U.S. application Ser. No. 10/318,272, entitled, "Transaction Tracer," filed Dec. 12, 2002, which application is assigned to the owner of the present technology, and which application is incorporated by reference herein in its entirety. In general, such a system monitors transactions in a computing environment. Data is collected about a set of one or more transactions. This data is then tested against a set of criteria. Transactions meeting the criteria are reported. In one embodiment, data for transactions not meeting the criteria is discarded. The reported data can be used to identify which portion of the software is executing too slowly or otherwise not functioning properly.

In one embodiment, a user specifies a threshold trace period and can initiate transaction tracing on one, some or all transactions running on a software system. Transactions with an execution time that exceeds the threshold trace period are reported to the user using a graphical user interface. The graphical user interface can include visualizations for reported transactions that enable the user to immediately understand where time was spent in the traced transaction.

FIG. 10 is a conceptual view of the components of the application performance management tool. The figure shows a managed application 200 monitored by the transaction monitoring system. The transaction monitoring system instruments (i.e., modifies) the bytecode of the managed application 200 by adding probes 202, 204 to the bytecode. The probes measure specific pieces of information about the managed application without changing the application's business logic. An agent 208 is also installed on the same machine as the managed application 200. More information about modifying bytecode can be found in U.S. Pat. No. 6,260,187, entitled "System for Modifying Object Oriented Code", which patent is assigned to the owner of the present technology and which patent is hereby incorporated by reference herein in its entirety. The transaction monitoring system further instruments bytecode by adding new code to the managed application that activates a tracing mechanism when a method of the managed application starts and terminates the tracing mechanism when the method completes.

FIG. 10 also depicts enterprise manager 220, database 222, workstation 224 and workstation 226. As a managed application runs, the probes (e.g. 202 and/or 204) relay data to agent 208. Agent 208 then collects and summarizes the data, and sends it to enterprise manager 220. Enterprise manager 220 receives performance data from managed applications via agent 208, runs requested calculations, makes performance data available to workstations (e.g. 224 and 226) and optionally sends performance data to database 222 for later analysis. The workstations (e.g. 224 and 226) may be the graphical user interface for viewing performance data. The workstations are used to create custom views of performance data which can be monitored by a human operator. In one embodiment, the workstations consist of two main windows: a console and an explorer. The console displays performance data in a set of customizable views. The explorer depicts alerts and calculators that filter performance data so that the data can be viewed in a meaningful way. The elements of the workstation that organize, manipulate, filter and display performance data include actions, alerts, calculators, dashboards, persistent collections, metric groupings, comparisons, smart triggers and SNMP collections.

The components 200, 220, 222, 224 and 226 shown in FIG. 10 may each operate on a separate computing system, or two or more of these components may be combined into a single computing system. The computing system for any or all of these components can be any of various different types of computing devices, including personal computers, minicomputers, mainframes, servers, handheld computing devices, mobile computing devices, etc. A sample computing environment 300 which may describe any of components 200, 220, 222, 224 and 226 is shown and described below with respect to FIG. 11. The inventive system is operational with numerous other general purpose or special purpose computing systems, environments or configurations. Examples of well known computing systems, environments and/or configurations that may be suitable for use with the inventive system include, but are not limited to, personal computers, server computers, multiprocessor systems, microprocessor-based systems, set top boxes, programmable consumer electronics, network PCs, minicomputers, mainframe computers, laptop and palm computers, hand held devices, distributed computing environments that include any of the above systems or devices, and the like.

Figure 11:
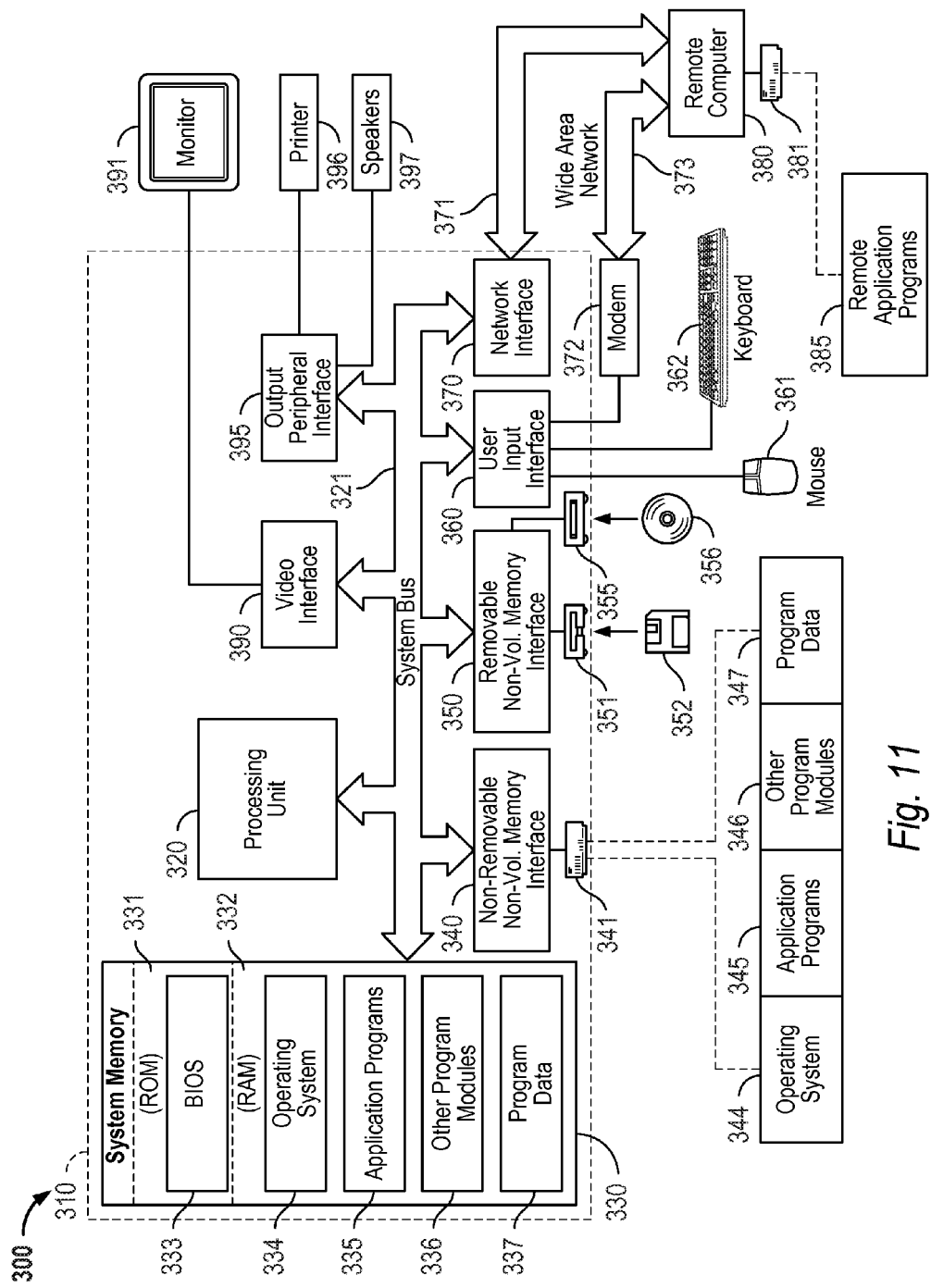
FIG. 11 is a block diagram of a computing system environment capable of implementing the present system.

With reference to FIG. 11, an exemplary system for implementing the inventive system includes a general purpose computing device in the form of a computer 310. Components of computer 310 may include, but are not limited to, a processing unit 320, a system memory 330, and a system bus 321 that couples various system components including the system memory to the processing unit 320. The system bus 321 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 310 may include a variety of computer readable media. Computer readable media can be any available media that can be accessed by computer 310 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, random access memory (RAM), read only memory (ROM), EEPROM, flash memory or other memory technology, CD-ROMs, digital versatile discs (DVDs) or other optical disc storage, magnetic cassettes, magnetic tapes, magnetic disc storage or other magnetic storage devices, or any other medium which can be used to store the desired information and which can be accessed by computer 310. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above are also included within the scope of computer readable media.

The system memory 330 includes computer storage media in the form of volatile and/or nonvolatile memory such as ROM 331 and RAM 332. A basic input/output system (BIOS) 333, containing the basic routines that help to transfer information between elements within computer 310, such as during start-up, is typically stored in ROM 331. RAM 332 typically contains data and/or program modules that are immediately accessible to and/or presently being operated on by processing unit 320. By way of example, and not limitation, FIG. 11 illustrates operating system 334, application programs 335, other program modules 336, and program data 337.

The computer 310 may also include other removable/non-removable, volatile/nonvolatile computer storage media. By way of example only, FIG. 11 illustrates a hard disc drive 341 that reads from or writes to non-removable, nonvolatile magnetic media and a magnetic disc drive 351 that reads from or writes to a removable, nonvolatile magnetic disc 352. Computer 310 may further include an optical media reading device 355 to read and/or write to an optical media.

Other removable/non-removable, volatile/nonvolatile computer storage media that can be used in the exemplary operating environment include, but are not limited to, magnetic tape cassettes, flash memory cards, DVDs, digital video tapes, solid state RAM, solid state ROM, and the like. The hard disc drive 341 is typically connected to the system bus 321 through a non-removable memory interface such as interface 340, magnetic disc drive 351 and optical media reading device 355 are typically connected to the system bus 321 by a removable memory interface, such as interface 350.

The drives and their associated computer storage media discussed above and illustrated in FIG. 11, provide storage of computer readable instructions, data structures, program modules and other data for the computer 310. In FIG. 11, for example, hard disc drive 341 is illustrated as storing operating system 344, application programs 345, other program modules 346, and program data 347. These components can either be the same as or different from operating system 334, application programs 335, other program modules 336, and program data 337. Operating system 344, application programs 345, other program modules 346, and program data 347 are given different numbers here to illustrate that, at a minimum, they are different copies. A user may enter commands and information into the computer 310 through input devices such as a keyboard 362 and a pointing device 361, commonly referred to as a mouse, trackball or touch pad. Other input devices (not shown) may include a microphone, joystick, game pad, satellite dish, scanner, or the like. These and other input devices are often connected to the processing unit 320 through a user input interface 360 that is coupled to the system bus 321, but may be connected by other interface and bus structures, such as a parallel port, game port or a universal serial bus (USB). A monitor 391 or other type of display device is also connected to the system bus 321 via an interface, such as a video interface 390. In addition to the monitor, computers may also include other peripheral output devices such as speakers 397 and printer 396, which may be connected through an output peripheral interface 395.

The computer 310 may operate in a networked environment using logical connections to one or more remote computers, such as a remote computer 380. The remote computer 380 may be a personal computer, a server, a router, a network PC, a peer device or other common network node, and typically includes many or all of the elements described above relative to the computer 310, although only a memory storage device 381 has been illustrated in FIG. 11. The logical connections depicted in FIG. 11 include a local area network (LAN) 371 and a wide area network (WAN) 373, but may also include other networks. Such networking environments are commonplace in offices, enterprise-wide computer networks, intranets and the Internet.

When used in a LAN networking environment, the computer 310 is connected to the LAN 371 through a network interface or adapter 370. When used in a WAN networking environment, the computer 310 typically includes a modem 372 or other means for establishing communication over the WAN 373, such as the Internet. The modem 372, which may be internal or external, may be connected to the system bus 321 via the user input interface 360, or other appropriate mechanism. In a networked environment, program modules depicted relative to the computer 310, or portions thereof, may be stored in the remote memory storage device. By way of example, and not limitation, FIG. 11 illustrates remote application programs 385 as residing on memory device 381. It will be appreciated that the network connections shown are exemplary and other means of establishing a communication link between the computers may be used.

In some embodiments, all or part of the transaction management system may be implemented in software that is stored on one or more processor readable storage devices and is used to program one or more processors. Referring again to FIG. 10, enterprise manager 220 further includes a CODEC having the encoding engine 230 and decoding engine 232 for performing the high order compression scheme as described above on some or all data transmitted to or from the enterprise manager 220, or for data that is stored on the enterprise manager. It is understood that a CODEC including engines 230 and 232 may alternatively or additionally be provided on one or more of the computing systems hosting the managed application 200, the workstations 224, 226 and/or the database 222 to encode data sent from, received by and/or stored on those computing systems.

In general, the encoding engine 232 is capable of receiving integer values from a storage media on one of components 200, 220, 222, 224 and 226, encoding those values, and then storing the encoded values on a storage media of one or more of components 200, 220, 222, 224 and 226. In embodiments, the encoding engine 232 outputs encoded values, and new files and/or data structures are then generated to store those values. Similarly, the decoding engine is capable of receiving encoded values from a storage media on one of components 200, 220, 222, 224 and 226, decoding those values, and then outputting (including possibly displaying) the decoded values to one or more of components 200, 220, 222, 224 and 226. In embodiments, the decoding engine 232 outputs integer values, and new files and/or data structures are then generated to output and/or store those values on storage media.

In one embodiment, a user of the system in FIG. 10 can initiate transaction tracing on all or some of the agents managed by an enterprise manager by specifying a threshold trace period. All transactions inside an agent whose execution time exceeds this threshold level will be traced and reported to the enterprise manager 220, which will route the information to the appropriate workstations who have registered interest in the trace information. The workstations will present a GUI that lists all transactions exceeding the threshold. For each listed transaction, a visualization that enables a user to immediately understand where time was being spent in the traced transaction can be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A system of storing integer data values, comprising:
    an enterprise manager comprising one or more servers and a database;

a webserver remote from the one or more servers of the enterprise manager and comprising memory for storing software code for implementing a website, the webserver connected to the one or more servers of the enterprise manager via a communications interface;

an software agent running on the webserver for transferring data from the webserver to the database of the enterprise manager; and a processor on at least one of the one or more servers of the enterprise manager and the webserver, the processor storing integer values in at least one of the memory of the webserver and the database of the enterprise manager, the integer data values stored in at least one of the database and memory using a known gamut of integers and having a maximum integer value including a maximum number of binary digits, the processor further a) determining a number, N, of digits in the binary representation of the integer value stored in the database of the server associated with the website;

b) determining a number, N', of digits in the binary representation of N;

c) transforming the number of integers that may be stored in the database of the server associated with the website from a first number of integers to a second, larger number of integers by encoding the integer value as an encoded value, if the $\log_2$ of N is equal to the $\log_2$ of a predefined gamut range of the value to be encoded, the encoded value having:
   i) a first component equal to N'−1 number of zeros, and
   ii) a second component, appended to the first component, equal to the binary representation of the integer value with the most significant bit removed; and d) storing the encoded value in at least one of the database and memory, storing and transferring the encoded value increasing the efficiency of at least one of the enterprise manager and webserver by allowing greater compression of the encoded value while allowing full reconstruction of the integer represented by the encoded value.

2. The system of claim 1, where, if N is less than the maximum number of binary digits in the maximum integer value for the data system, encoding the integer value as a binary number having:
   i) a first component equal to N'−1 number of zeros,
   ii) a second component, appended to the first component, equal to the binary representation of N, and
   iii) a third component, appended to the second component, equal to the binary representation of the integer value with the most significant bit removed.

3. The system of claim 1, where said step (d) of outputting the encoded value comprises the step of transmitting the encoded value from a first computing device to a second computing device via a network connection.

4. The system of claim 1, where said step (d) of outputting the encoded value comprises the step of storing the encoded value on a persistent storage media.

5. The system of claim 4, where the number of integers in the gamut is one of 4, 16, 256 and 65536.

6. The system of claim 1, where said step (d) of outputting the encoded value comprises the step of outputting the encoded value one subcomponent at a time, the first subcomponent first and the second subcomponent second, for storage on a FIFO data structure.

7. The system of claim 1, where said step (d) of outputting the encoded value comprises the step of outputting the encoded value one subcomponent at a time, the second subcomponent first and the first subcomponent second, for storage on a LIFO data structure.

8. The system of claim 1, where the number of integers in the gamut is equal to $2^i$, where i is a power of 2.

9. The system of claim 1, further comprising a step (e) of regularizing the gamut of integer values in the data system by shifting at least a portion of the integer values up or down by a predetermined constant value.

\* \* \* \* \*